US008334170B2

(12) United States Patent
Wang et al.

(10) Patent No.: US 8,334,170 B2
(45) Date of Patent: Dec. 18, 2012

(54) METHOD FOR STACKING DEVICES

(75) Inventors: Dean Wang, Tainan (TW); Chien-Hsiun Lee, Hsinchu (TW); Chen-Shien Chen, Zhubei (TW); Clinton Chao, Hsinchu (TW); Mirng-Ji Lii, Hsinchu County (TW); Tjandra Winata Karta, Hsin-Chu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 485 days.

(21) Appl. No.: 12/163,464

(22) Filed: Jun. 27, 2008

(65) Prior Publication Data
US 2009/0321948 A1 Dec. 31, 2009

(51) Int. Cl.
*H01L 23/498* (2006.01)
*H01L 21/56* (2006.01)
(52) U.S. Cl. . 438/109; 257/621; 257/686; 257/E23.067; 257/E21.503; 438/127
(58) Field of Classification Search ................... 257/621, 257/686, 777, E23.067, E23.124, E21.503; 438/109, 127
See application file for complete search history.

(56) References Cited

U.S. PATENT DOCUMENTS

| | | | | |
|---|---|---|---|---|
| 3,427,273 A | * | 2/1969 | Newing, Jr. ................... | 524/806 |
| 4,811,082 A | | 3/1989 | Jacobs et al. | |
| 4,888,247 A | * | 12/1989 | Zweben et al. ................ | 428/105 |
| 4,990,462 A | | 2/1991 | Sliwa, Jr. | |
| 5,075,253 A | | 12/1991 | Sliwa, Jr. | |
| 5,128,746 A | * | 7/1992 | Pennisi et al. ................ | 257/738 |
| 5,380,681 A | | 1/1995 | Hsu | |
| 5,481,133 A | | 1/1996 | Hsu | |
| 6,002,177 A | | 12/1999 | Gaynes et al. | |
| 6,187,678 B1 | | 2/2001 | Gaynes et al. | |
| 6,229,216 B1 | | 5/2001 | Ma et al. | |
| 6,236,115 B1 | | 5/2001 | Gaynes et al. | |
| 6,271,059 B1 | | 8/2001 | Bertin et al. | |
| 6,279,815 B1 | | 8/2001 | Correia et al. | |
| 6,355,501 B1 | | 3/2002 | Fung et al. | |
| 6,434,016 B2 | | 8/2002 | Zeng et al. | |
| 6,448,661 B1 | | 9/2002 | Kim et al. | |
| 6,461,895 B1 | | 10/2002 | Liang et al. | |
| 6,562,653 B1 | | 5/2003 | Ma et al. | |
| 6,570,248 B1 | | 5/2003 | Ahn et al. | |
| 6,600,222 B1 | | 7/2003 | Levardo | |
| 6,607,938 B2 | | 8/2003 | Kwon et al. | |
| 6,661,085 B2 | | 12/2003 | Kellar et al. | |
| 6,703,075 B1 | * | 3/2004 | Lin et al. ........................ | 427/256 |
| 6,762,076 B2 | | 7/2004 | Kim et al. | |
| 6,790,748 B2 | | 9/2004 | Kim et al. | |
| 6,887,769 B2 | | 5/2005 | Kellar et al. | |

(Continued)

OTHER PUBLICATIONS

Quirk et al., Semiconductor Manufacturing Technology, 2001 Prentice Hall, pp. 21, 33-34.*

(Continued)

*Primary Examiner* — Paniel M Gumedzoe
(74) *Attorney, Agent, or Firm* — Haynes and Boone, LLP

(57) ABSTRACT

A method for fabricating a semiconductor device is provided which includes providing a first device, a second device, and a third device, providing a first coating material between the first device and the second device, the first coating material being uncured, providing a second coating material between the second device and the third device, the second coating material being uncured, and thereafter, curing the first and second coating materials in a same process.

14 Claims, 17 Drawing Sheets

U.S. PATENT DOCUMENTS

| | | |
|---|---|---|
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,198,693 B1 * | 4/2007 | Fuller et al. .................. 156/297 |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2001/0005935 A1 * | 7/2001 | Tandy ............................ 29/836 |
| 2005/0280160 A1 * | 12/2005 | Kim et al. ..................... 257/777 |
| 2006/0008974 A1 * | 1/2006 | Imai .............................. 438/232 |
| 2006/0273455 A1 | 12/2006 | Williams et al. |
| 2007/0048969 A1 * | 3/2007 | Kwon et al. .................. 438/455 |
| 2007/0231965 A1 * | 10/2007 | Myers .......................... 438/109 |
| 2008/0061402 A1 * | 3/2008 | Ishihara et al. ............... 257/621 |
| 2008/0073741 A1 * | 3/2008 | Apanius et al. .............. 257/434 |
| 2009/0294954 A1 * | 12/2009 | Bakir et al. .................. 257/713 |

OTHER PUBLICATIONS

JA Myeong Koo et al., "Mechanical and Electrical Properties of Sn-3.5Ag Solder/Cu BGA Packages during Multiple Reflows", 2005 Trans Tech Publications, Switzerland, 1 page.

Charles W. C. Lin et al., "3D Stackable Packages With Bumpless Interconnect Technology", 2003 Electronics Packaging Technology Conference, 0-7803-8205-6/03, 2003 IEEE, pp. 8-12.

* cited by examiner

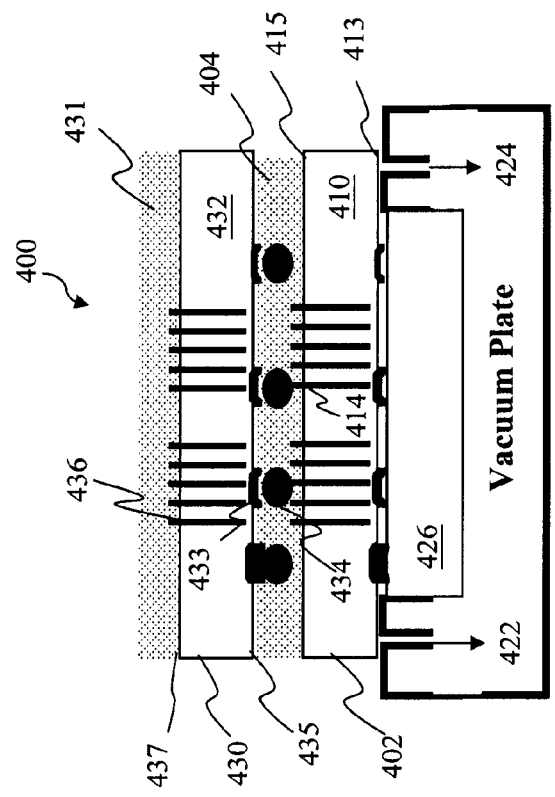
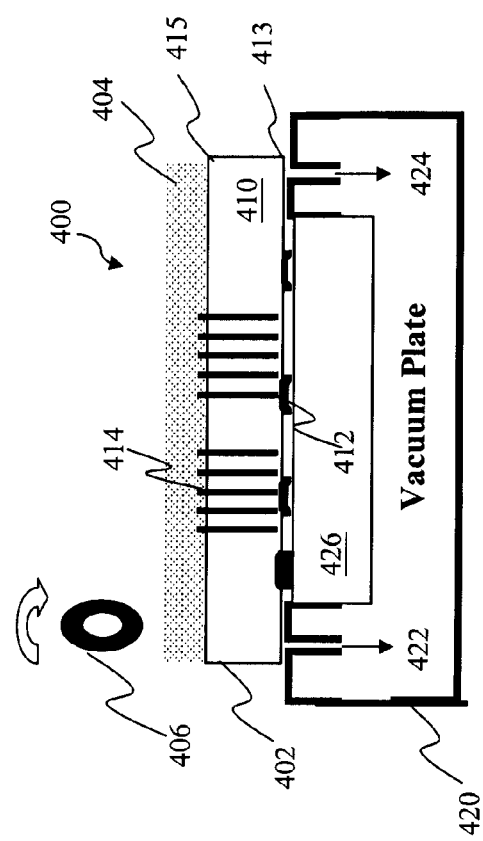
FIG. 4B
FIG. 4A

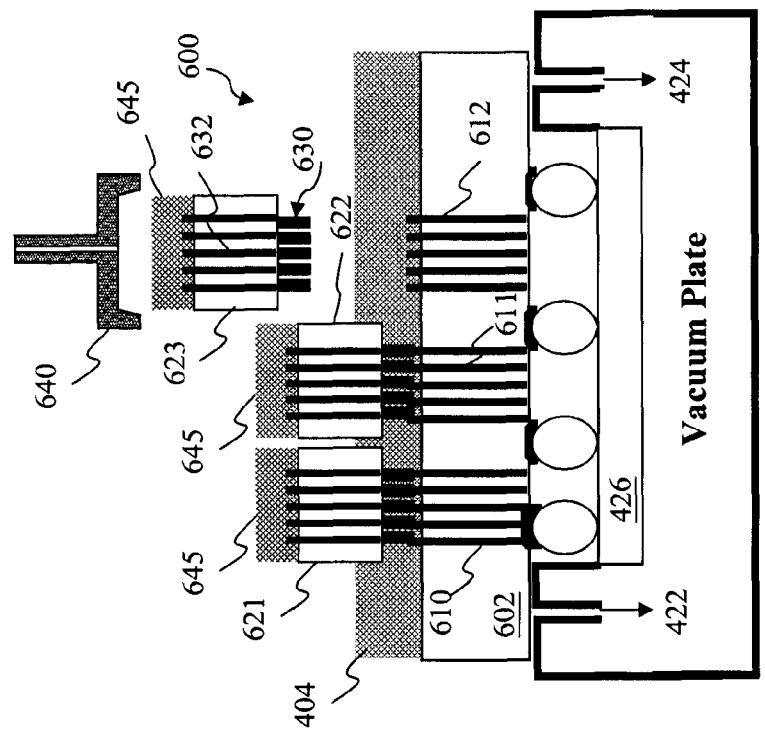
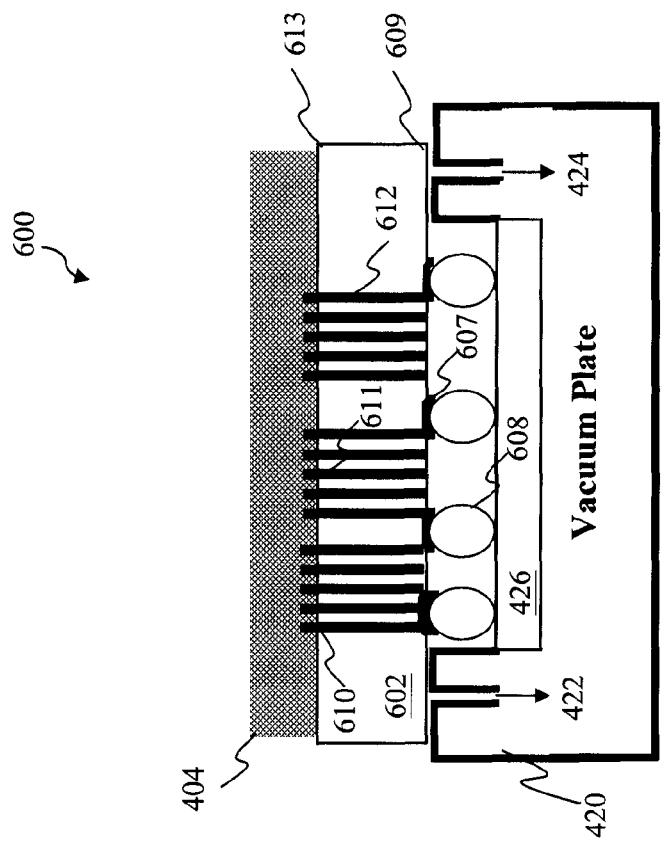
FIG. 6B
FIG. 6A

METHOD FOR STACKING DEVICES

BACKGROUND

The present disclosure relates generally to semiconductor manufacturing and, more particularly, to a method for fabricating a stacked semiconductor device.

Vias have been routinely used in semiconductor fabrication to provide electrical coupling between one or more layers of conductive material within a semiconductor device. More recently, through-silicon vias (TSV) have arisen as a method of overcoming limitations of conventional wire bonding for example, as performance and density requirements increase no longer allowing traditional wire bonding to be adequate. TSV allow for shorter interconnects by forming an interconnect in the z-axis. The interconnect is created through a substrate (e.g. wafer), by forming a via extending from a front surface to a back surface of the substrate. TSV are also useful in forming interconnects for stacked wafers, stacked chip, and/or combinations thereof for 3-D packaging technologies.

In fabricating stacked semiconductor devices, a liquid noflow underfill (NFU) including a flux is typically used for stacking and coupling two devices. The NFU layer is subjected to a thermal process (e.g., curing/reflow cycle) in which the NFU layer is cured and encapsulates the structures in a region between the devices. Also, solder bumps of one of the devices are reflowed and form a solder joint with TSV structures of the other device such that the devices become electrically coupled. For each additional device that is to be stacked and coupled, an additional NFU layer is provided and the thermal process is repeated. Although this method has been satisfactory for its intended purpose, it has not been satisfactory in all respects. One of the disadvantages is that the lower NFU layers are subjected to many curing/reflow cycles during the fabrication of stacked semiconductor device. This may increase the thermal stress of the NFU layer, and may induce various defects such as voids in the NFU layer, bump cracks or fracture, and peeling of the NFU layer, and thus may lead to poor device performance and reliability.

Therefore, a need exists for a method for fabricating a stacked semiconductor device that reduces the thermal stress of the coating material between devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A to 4E, illustrated are cross-sectional views a stacked semiconductor device at various stages of fabrication according to the method of FIG. 3;

FIGS. 6A to 6F, illustrated are cross sectional views of a stacked semiconductor device at various stages of fabrication according to the method of FIG. 5;

DETAILED DESCRIPTION

The present disclosure relates generally to semiconductor manufacturing and more particularly, to a method for fabricating a stacked semiconductor device. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over, on, adjacent, abutting, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, including for example, etching a substrate, may include embodiments where features are formed above the surface of the substrate, directly on the surface of the substrate, and/or extending below the surface of the substrate.

Figures 1A, 1B:
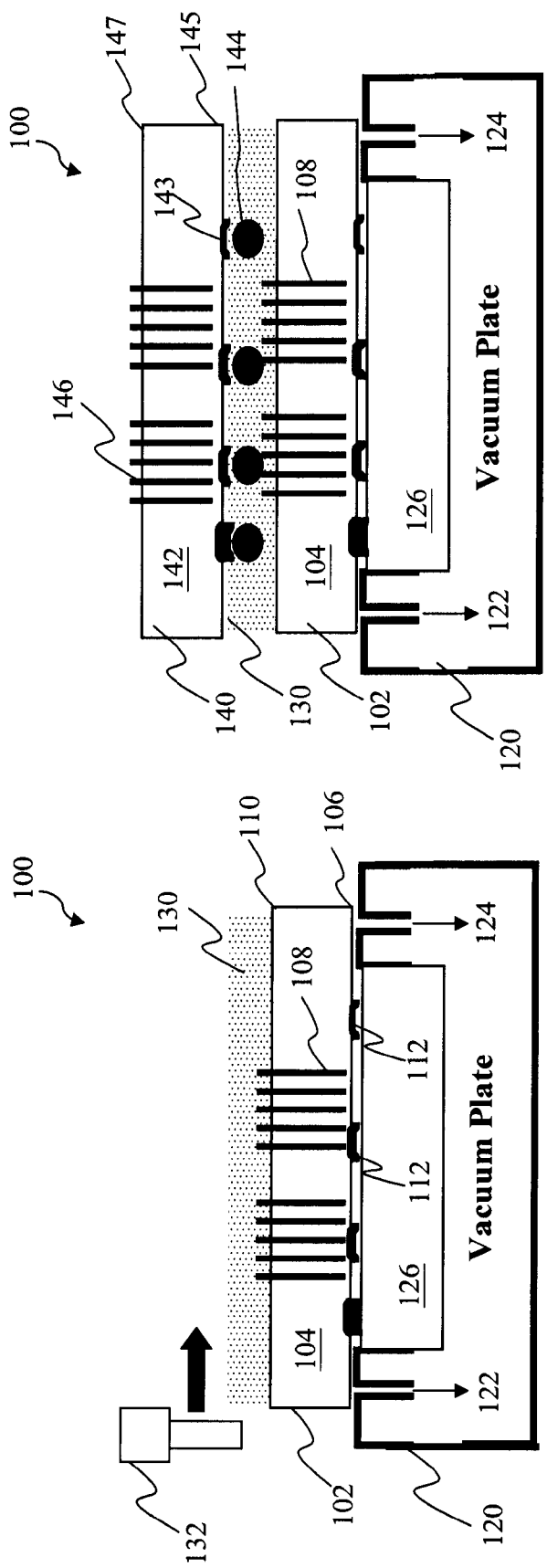
FIGS. 1A to 1G, illustrated are cross sectional views of a stacked semiconductor device at various stages of fabrication.

Referring to FIGS. 1A to 1G, illustrated are cross sectional views of a stacked semiconductor device 100 at various stages of fabrication. In FIG. 1A, the semiconductor device 100 may include a first level device 102 having a circuit. Accordingly, the device 102 may comprise a substrate 104 that includes one or more features formed on the substrate. These features are not illustrated but may be present on the substrate 104, and may include, for example, gate structures, source/drain regions, other doped regions, isolation structures, contacts to one or more of the gate, source, or drain regions, memory elements (e.g., memory cells), and/or other features known in the art. The device 102 may further include one or more metal layers and inter-layer dielectric (collectively referred to as interconnect structure) formed on the front surface 106 of the substrate 104. The device 102 may further include one or more contact pads that provide electrical contact to the interconnect structure.

The device 102 may further include a plurality of through-silicon via (TSV) structures 108 formed on and in the substrate 104. The TSV structures 108 may be vertical conductive structures that pass through the substrate 104. Also, the TSV structures 108 may be electrically coupled to the contact pads, and electrically coupled to the interconnect structure. The TSV structures 108 may be exposed from the back surface 110 of the substrate 104 for 3-D packaging such as stacking and coupling to other devices as will be discussed later herein. The device 102 may further include a plurality of bonding pads 112 that are electrically coupled to the interconnect structure, and may support conductive features such as solder bumps (or balls) for use in flip-chip packaging technology and other suitable packaging technologies.

The device 102 may be secured to a vacuum plate 120 that is capable of providing a vacuum suction force 122, 124. The vacuum plate 120 may also provide a stable base support for stacking a number of devices to form the stacked semiconductor device 100. The vacuum plate 120 may include a support plate 126 with a buffer layer formed thereon for supporting an area of the front surface 106 of the device 102 that includes various structures such as bonding pads 112. Accordingly, these various structures on the front surface 106 of the device 102 are protected from being damaged during the stacking process. The area of the front surface 106 of the device 102 that does not include external structures has a substantially flat surface, and may be well suited for securing to the vacuum plate 120 via the suction force 122, 124. Alternatively, the device 102 may optionally be secured to a carrier substrate with an adhesive material.

A layer 130 of a liquid no-flow underfill (NFU) may be formed on the back surface 110 of the device 102. The NFU may function as both a low viscosity liquid epoxy material for encapsulating, and a flux component for reflowing. The layer 130 of NFU may be applied (referred to as NFU printing) to the back surface 110 by a dispenser 132. It should be noted that "front" and "back" such as the front surface of the substrate and the back surface of the substrate, as used herein are arbitrary and the surfaces of the substrate may be referenced by any suitable convention.

In FIG. 1B, the semiconductor device 100 may include a second level device 140 with a circuit. Accordingly, the device 140 may include a substrate 142 having various features (similar to the features discussed in device 102) that function as the circuit, a plurality of bonding pads 143 and micro bumps 144 formed on the front surface 145 that are electrically coupled to the circuit, and a plurality of TSV structures 146 that extend through the substrate and may be exposed from the back surface 147. The device 140 may placed overlying the layer 130 and the device 102 such that the micro bumps 144 are in contact and aligned with the proper TSV structures 108 of device 102.

Figure 1D:
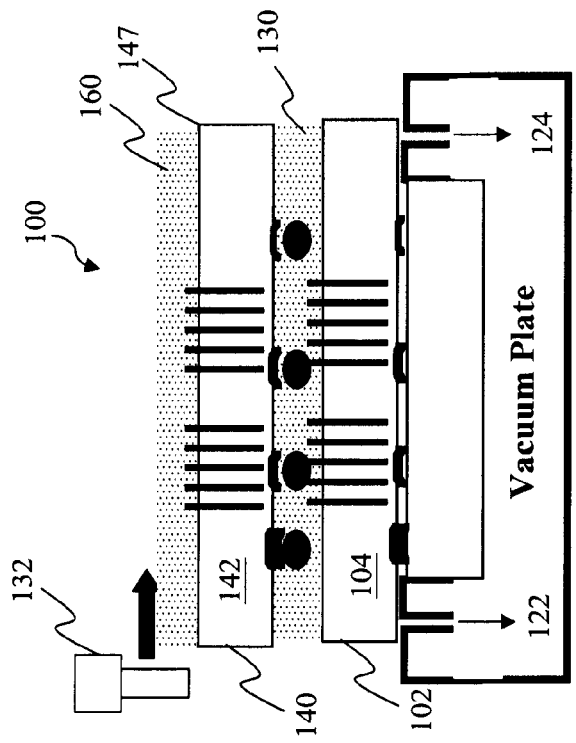
Figure 1C:
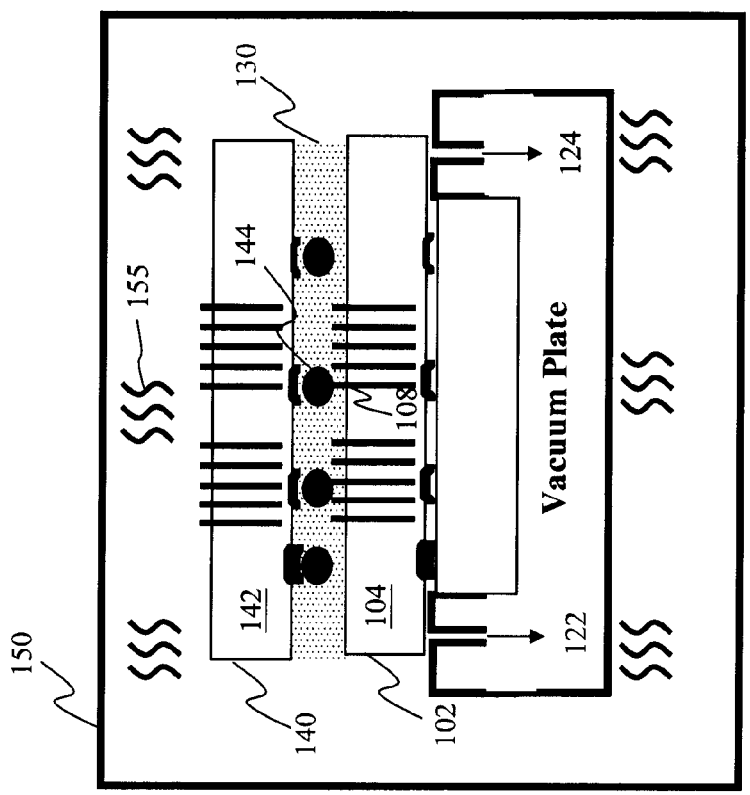

In FIG. 1C, the semiconductor device 100 including device 102 and device 140 may be transferred to a heating chamber 150 such as an oven, and the semiconductor device 100 may be heated 155 to a desired temperature or range of temperatures for a period of time (e.g., curing/reflow cycle). For example, the temperature range may be from 200 to 300° C. As previously noted, the layer 130 includes an epoxy material for encapsulating and a flux component for reflowing. Accordingly, responsive to the heating, the epoxy material fully cures and encapsulates the various structures between the device 102 and the device 140. This provides the required mechanical strength and stability for stacking and bonding the device 102 to device 140. Simultaneously, the flux component reflows the micro bumps 144 of device 140, and forms a solder joint with the TSV structure 108 of device 102. As such, the circuit of device 102 may be electrically coupled to the circuit of device 140.

In FIG. 1D, a layer 160 of a liquid NFU may be formed on the back surface 147 of the device 140 via the dispenser 132. As previously noted, the NFU may function as both a low viscosity liquid epoxy material for underfilling or encapsulating, and a flux component for reflowing or soldering. In FIG. 1E, the semiconductor device 100 may include a third level device 170 with a circuit. Accordingly, the device 170 may include a substrate 172 having various features (similar to the features discussed in device 102) that function as the circuit, a plurality of bonding pads 173 and micro bumps 174 formed on the front surface 175 that are electrically coupled to the circuit, and a plurality of TSV structures 176 that extend through the substrate and may be exposed from the back surface 177. The device 170 may placed overlying the layer 160 and the device 140 such that the micro bumps 174 are in contact and aligned with the proper TSV structures 146 of device 140.

Figure 1F:
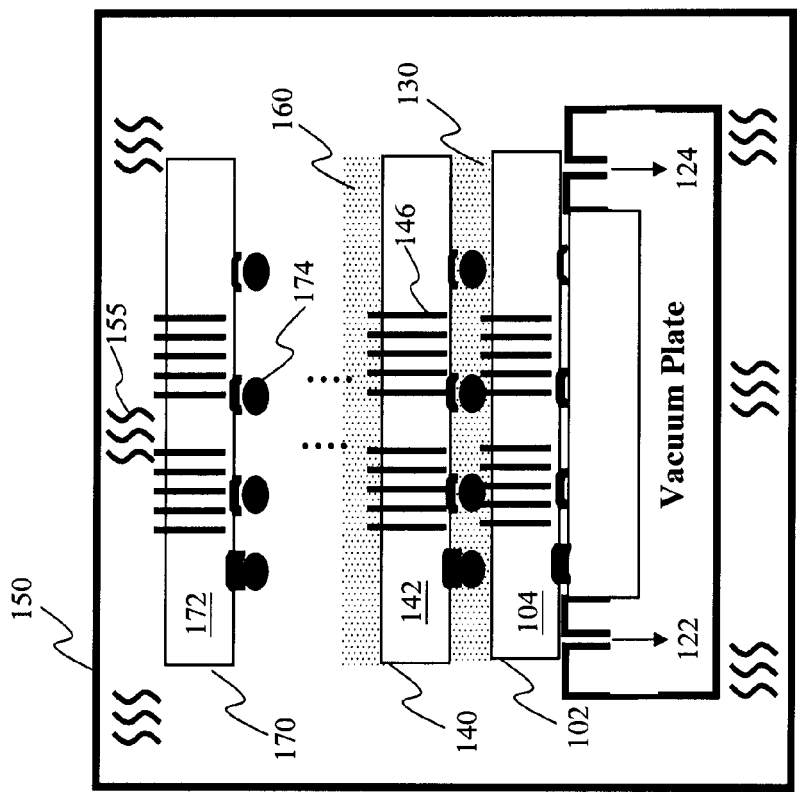
Figure 1E:
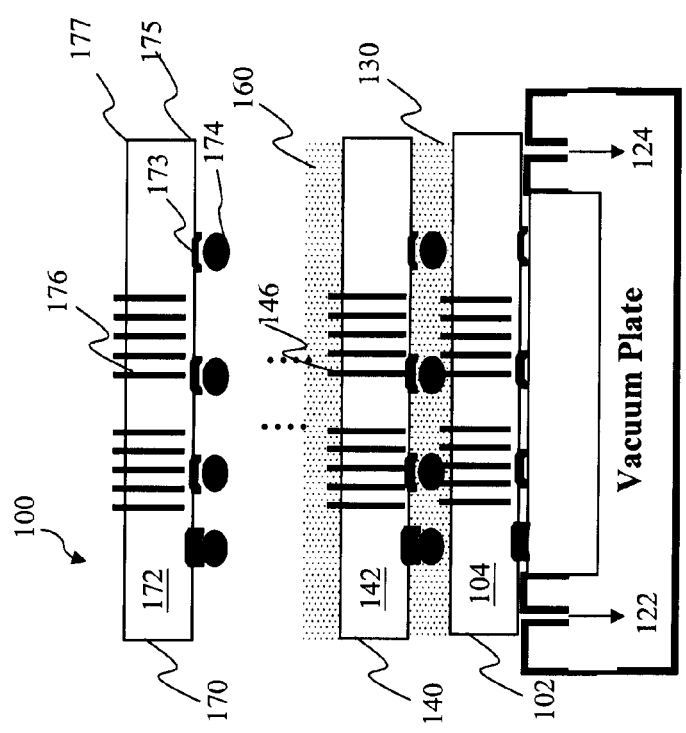
Figure 1G:
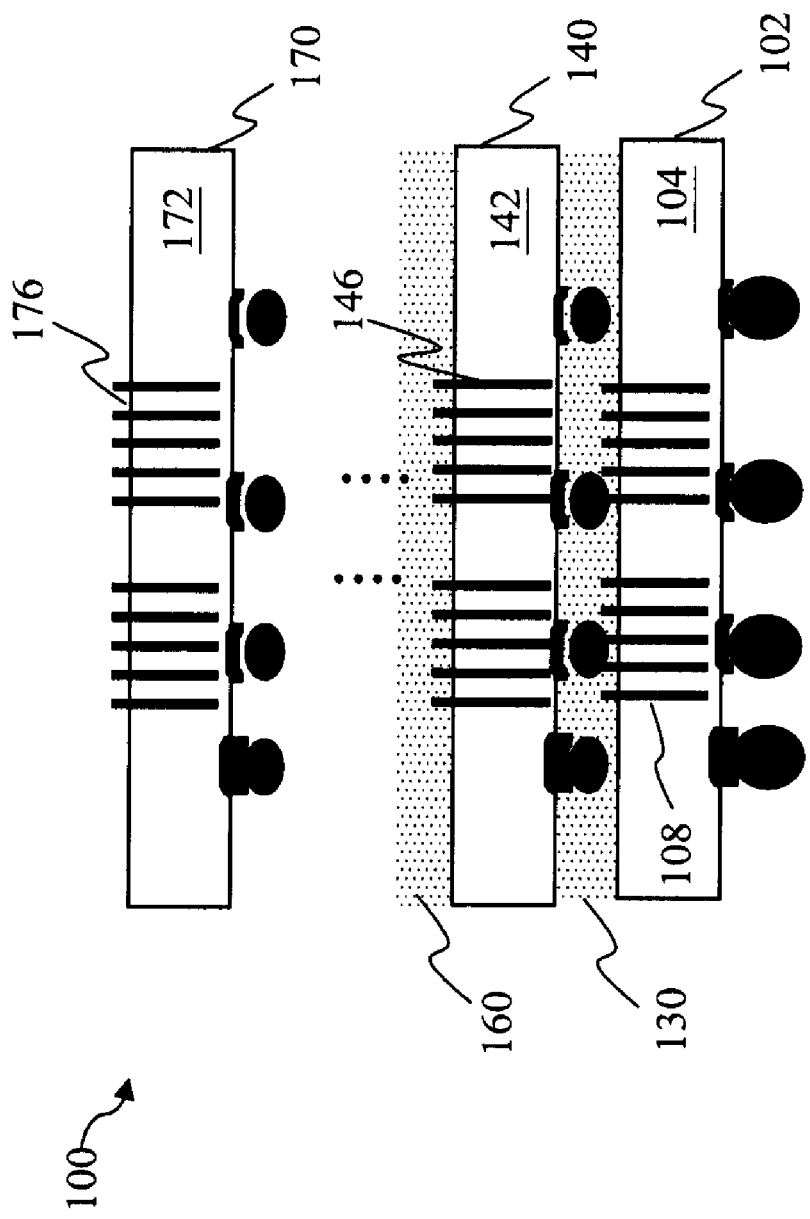

In FIG. 1F, the semiconductor device 100 including device 102, device 140, and device 170 may be placed in the heating chamber 150, and the semiconductor device 100 may be heated 155 to a desired temperature or range of temperatures for a period of time (e.g., cycle) similar to the thermal process of FIG. 1C. The layer 160 fully cures and encapsulates the structures between the device 140 and the device 170, and the flux component reflows the micro bumps 174 to form a solder joint with the TSV structure 146 of device 140. However, the fully cured layer 130 is subjected to another thermal cycle, and the thermal stress of layer 130 may be increased. In FIG. 1G, the process above is repeated for each additional device that is to be stacked, and the number of devices may depend on the application and/or design requirements. After the last device has been stacked and the last layer of NFU layer has been fully cured, the vacuum suction force 122, 124 may be turned off, and the semiconductor device 100 may be removed from the vacuum plate 120 for further processing.

Figure 2:
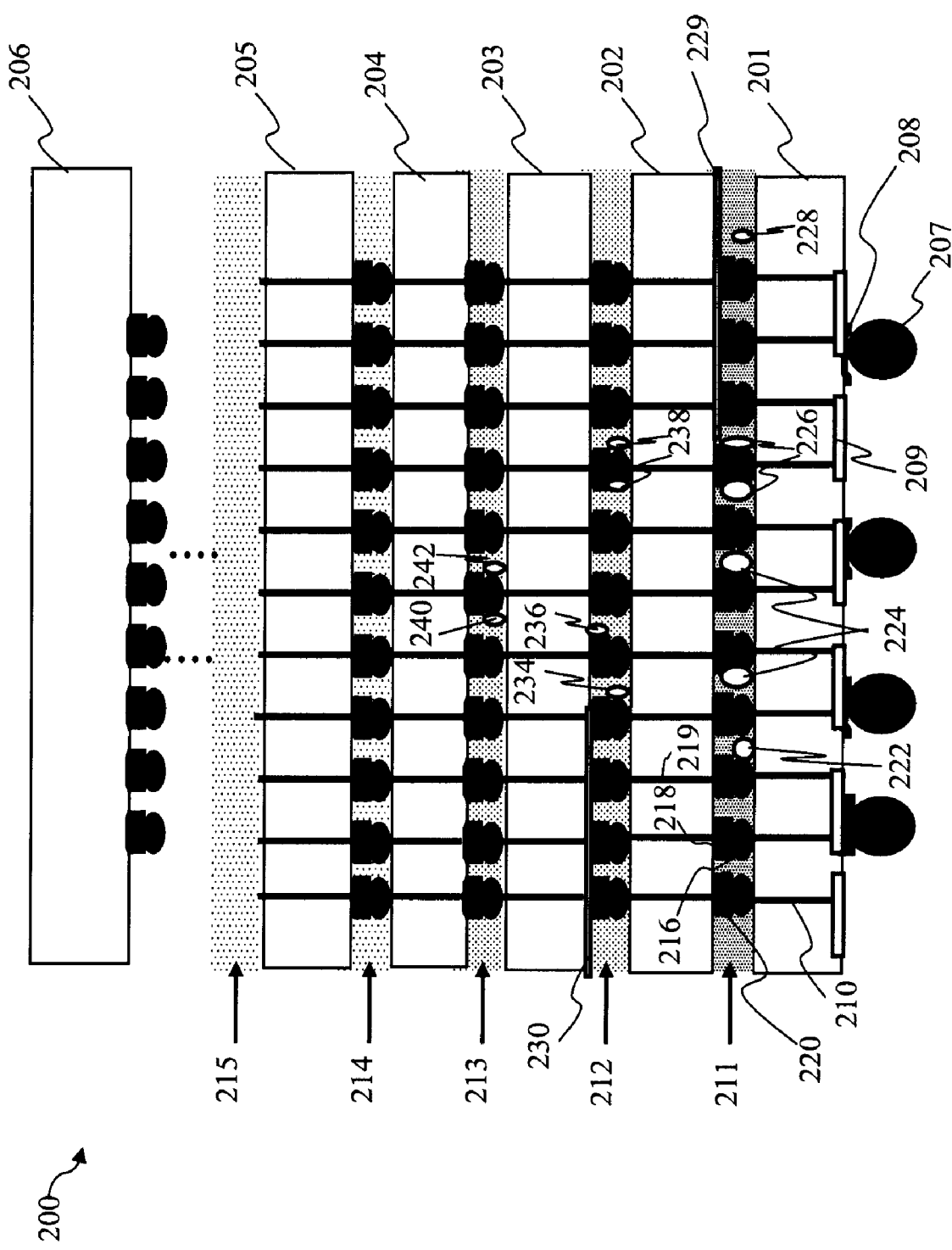
FIG. 2, illustrated is a cross sectional view of a stacked semiconductor device with various defects that may be induced during fabrication.

Referring to FIG. 2, illustrated are various defects that may be induced during the fabrication of a stacked semiconductor 200. The stacked semiconductor 200 may be similarly fabricated as was discussed in the stacked semiconductor 100 of FIG. 1. The stacked semiconductor 200 may include a first 201, second 202, third 203, fourth 204, fifth 205, and nth 206 device (where n is the total number of devices being stacked). The device 201 may include a plurality of solder bumps (or balls) 207 each formed on a bonding pad 208 for use in flip-chip packaging technology or other suitable packaging technologies. The device 201 may further include a plurality of redistribution layer (RDL) structures 209 for rerouting bonding pads to various areas of the device 201. The device 201 may further include a plurality of TSV structures 210 for coupling to other devices in 3-D device packaging and/or device stacking configurations.

As previously discussed, a NFU layer 211 (similar to the layer 130 of FIG. 1) may be dispensed (also referred to as NFU printing) over the device 201, and the device 202 may be placed overlying the NFU layer 211 and the device 201. The device 202 may include a plurality of micro bumps (or balls) 216 each formed on a bonding pad 218 for coupling to one or more TSV structures 210 of device 201. The NFU layer 211 may then be subjected to a thermal process to cure the NFU layer 211 and reflow the micro bumps to electrically couple the devices 201 and 202. The device 202 may further include one or more TSV structures 219 for coupling to another device in 3-D device packaging and/or device stacking configurations. The process above is repeated for each of the other devices 203, 204, 205, 206 to form the stacked semiconductor device 200. Accordingly, the NFU layer 211 may be subjected to (n−1) times of curing/reflow cycles, NFU layer 212 may be subjected to (n−2) times of curing/reflow cycles, NFU layer 213 may be subjected to (n−3) times of curing/reflow cycles, NFU layer 214 may be subjected to (n−4) times of curing/reflow cycles, and NFU layer 215 may be subjected to (n−5) times of curing/reflow cycles, and so forth. Therefore, each of the NFU layers 211-215 may have a different thermal history or cycle than the others, with the NFU layer 211 having the longest thermal cycle and the NFU layer 215 having the shortest thermal cycle (e.g., for n=6 total devices).

It has been observed that various defects may be induced with the increase in the thermal history or cycle of the NFU layer. That is, the longer or more times the NFU layer is subjected to thermal processing (e.g., curing/reflow cycles), the more likely defects will be induced by thermal stress experienced in the NFU layer. For example, the NFU layer 211 may have the longest thermal cycle, and the defects that may be induced include a bump crack or fracture 220 in which the micro bump may be separated from the bond pad, voids 222, 224, 226, 228 in the NFU layer 211, and delaminating or peeling 229 occurring at the interface of the NFU layer 211 and micro bumps 216. The NFU layer 212 may have the second longest thermal cycle, and thus similar defects may be induced such as laminating or peeling 230, and voids 234, 236, 238 in the NFU layer 212. The NFU layer 213 may have the third longest thermal cycle, and thus may induce defects such as voids 240, 242 in the NFU layer 213. The NFU layer 215 may have the shortest thermal cycle that includes one curing/reflow cycle, and thus may have substantially no or very few defects induced by thermal stress. However, the NFU layer 215 is a low viscosity liquid before being fully cured, and thus some defects such as voids may develop even after one curing/reflow cycle. These various defects can lead to poor device performance and reliability.

For the sake of example, an example device will be shown below in a series of processing operations to illustrate various embodiments of the present invention. It is understood that several processing steps may be only briefly described, such steps being well known to those of ordinary skill in the art. Also, additional processing steps can be added, and certain of the following processing steps can be removed and/or changed while still implementing the claimed invention. Thus, the following description should be understood to represent examples only, and are not intended to suggest that one or more steps is required. It should further be noted that "front" and "back" such as the front surface of the substrate and the back surface of the substrate, as used herein are arbitrary and the surfaces of the substrate may be referenced by any suitable convention.

Figure 3:
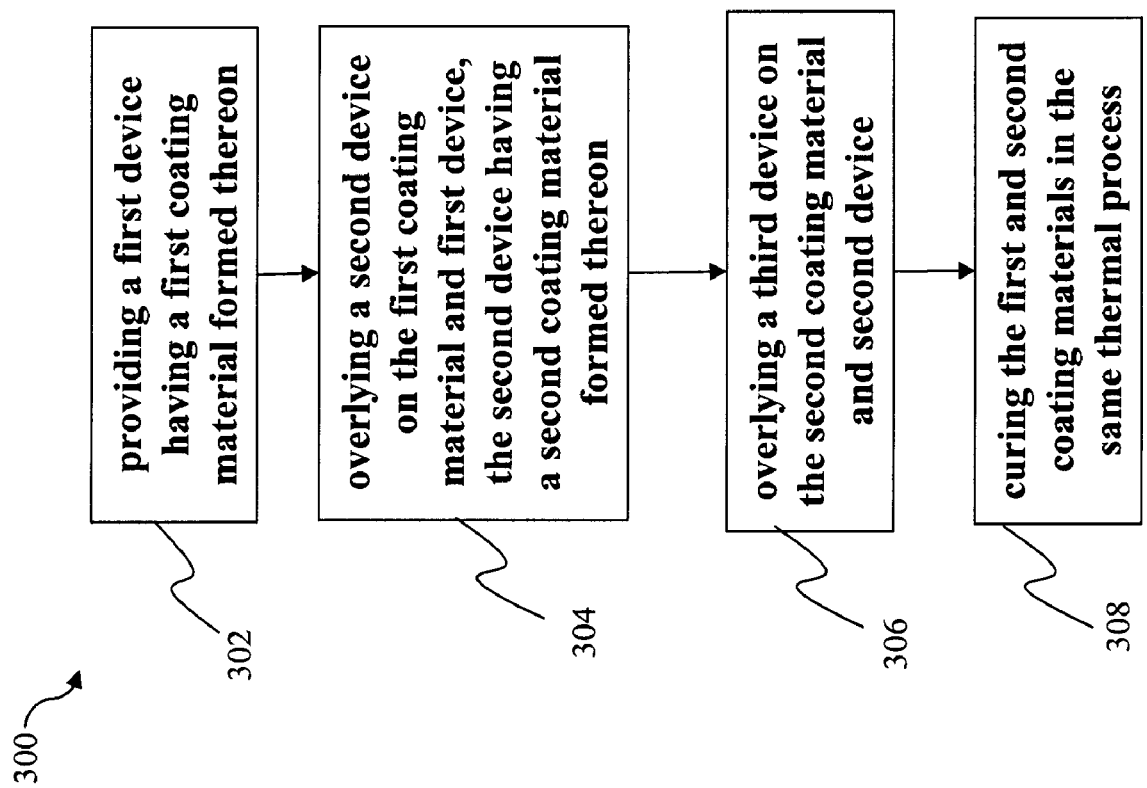
FIG. 3, illustrated is a flowchart of a method for fabricating a stacked semiconductor device according to various aspects of the present disclosure.
Figure 4D:
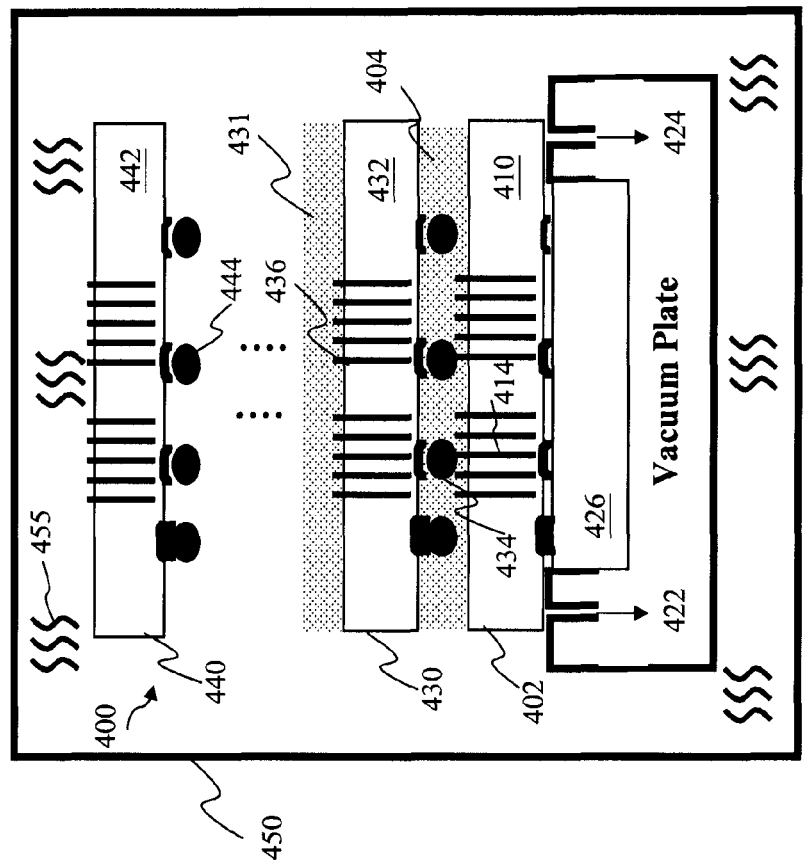

Referring to FIG. 3, illustrated is a method 300 for fabricating a stacked semiconductor device that utilizes one curing/reflow cycle. Referring also to FIGS. 4A to 4E, illustrated are cross sectional views of a stacked semiconductor device 400 being fabricated according to the method 300 of FIG. 3. In FIG. 4A, the method 300 begins with block 302 in which a first level device 402 may be provided with a first coating material 404 formed thereon.

The coating material 404 may be formed by applying a lamination or tape 406 having a polymer component and a flux component. The coating material 404 may include an epoxy polymer that is configured as a high viscosity solid film. Accordingly, the coating material 404 may have sufficient mechanical strength and stability to hold a device in place before the material is later fully cured. Alternatively, the coating material 404 may optionally be formed by a spin-coating process. For example, the coating material 404 may include a liquid epoxy polymer with a flux component that is applied to the device 402, and the coating material 404 may be subjected to a pre-treatment process. In the pre-treatment process, the coating material 404 may be heated to a temperature that is less than a curing temperature of the coating material 404. For example, the coating material 404 may be heated to a temperature from about 80 to about 150° C. The heating may include a heat source such as a flash lamp, ultraviolet illumination, or other suitable heating mechanisms. Accordingly, the coating material 404 may be transformed from a liquid to a B-stage polymer (e.g., intermediate stage between liquid and fully cured polymer), such that the viscosity of the coating material is increased. Thus, the coating material 404 may have sufficient mechanical strength and stability to hold a device in place before the material is later fully cured. Further, the coating material 404 may include a promoter for increasing the adhesive properties of the coating material 404, and other additives for enhancing the curing of the coating material 404.

The device 402 may include a circuit formed in a semiconductor substrate 410 such as a silicon in a crystalline structure. Alternatively, the substrate 410 may have an epitaxial layer overlying a bulk semiconductor. Further, the substrate 410 may be strained for performance enhancement. For example, the epitaxial layer may comprise semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 410 may include a semiconductor-on-insulator (SOI) structure. For example, the substrate 410 may include a buried oxide (BOX) layer formed by a process such as separation by implanted oxygen (SIMOX). The substrate 410 may include various doped wells, doped features, and semiconductor layers configured to form various microelectronic devices such as metal-oxide-semiconductor field effect transistor (MOSFET) including complementary metal-oxide-semiconductor (CMOS), imaging sensor including CMOS imaging sensor (CIS), micro-electro-mechanical system (MEMS), memory cells, and/or other suitable active and passive devices. The substrate 410 may also include various isolation features configured to separate different devices formed on the substrate. The isolation features may include different structures and can be formed using different processing technologies. For example, the isolation features may include dielectric isolation features such as shallow trench isolation (STI). The doped wells and doped features include p-type doped region and/or an n-type doped region, formed by a doping process such as ion implantation.

The device 402 may further include an interconnect structure with one or more metal layers that are configured to connect various doped regions and/or features in the semiconductor substrate 410, resulting in the functional circuit. The interconnect structure may include conductive materials such as copper, copper alloy, titanium, titanium nitride, tantalum, tantalum nitride, tungsten, polysilicon, metal silicide, or combinations. The copper interconnect may be formed by a technique such as CVD, sputtering, plating, or other suitable processes. Alternatively or additionally, an aluminum interconnect may be used and include an aluminum, aluminum/silicon/copper alloy, titanium, titanium nitride, tungsten, polysilicon, metal silicide, or combinations. The aluminum interconnect may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line).

The interconnect structure may include an inter-layer dielectric with a low dielectric constant such as less than about 3.5. The dielectric may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), and/or other suitable materials. The dielectric may be formed by a technique including spin-on, CVD, sputtering, or other suitable processes. The metal layers and inter-layer dielectric may be formed in an integrated process such as a damascene process or lithography/plasma etching process.

The device 402 may include a plurality of bonding pads 412 for supporting solder bumps (or balls) and other external bonding mechanisms for use in flip-chip packaging technology and other suitable packaging technologies. The device 402 may further include a plurality of redistribution layer (RDL) structures (not shown) for rerouting the bonding pads to various areas of the device 402. The bonding pads 412 may be formed within a passivation layer overlying the top metal layer on the front surface 413 of the substrate 410, and may be electrically coupled to the interconnect structure. The device 402 may further include a plurality of through-silicon via (TSV) structures 414. The TSV structures 414 may be vertical conductive structures that pass through the substrate 410, and may be electrically coupled to the interconnect structure and/or the bonding pads 412. The TSV structures 414 may be exposed from the back surface 415 of the substrate 410 for 3-D packaging such as stacking and coupling to other devices as will be discussed later herein. Such TSV 3-D packaging creates vertical connections through the substrate body, eliminates additional wires, and produces a flatter and more compact structure.

The device 402 may be secured to a vacuum plate 420 that is capable of providing a vacuum suction force 422, 424. The vacuum plate 420 may also provide a stable base support for stacking a number of devices to form the stacked semiconductor device 400. The vacuum plate 420 may include a support plate 426 with a buffer layer formed thereon for supporting an area of the front surface 413 of the device 102 that includes various structures such as bonding pads 412. Accordingly, these various structures on the front surface 413 of the device 402 are prevented from being damaged during the stacking process. The area of the front surface 413 of the device 402 that does not include external structures has a substantially flat surface, and may be well suited for securing to the vacuum plate 420 via the suction force 422, 424. Alternatively, the device 402 may optionally be secured to a carrier substrate with an adhesive material.

In FIG. 4B, the method 300 continues with block 304 in which a second level device 430 may be placed overlying the first coating material 404 and the first level device 402. The device 430 may include a second coating material 431 formed thereon. The coating material 431 may be similar to the coating material 404, and may be formed in a similar manner as discussed above. Also, the coating material 431 may be pre-laminated on the device 430 prior to being placed over the device 402, reducing processing time. The device 430 may further include a substrate 432 having various features (similar to the features discussed in device 402) that function as a circuit, a plurality of bonding pads 433 and micro bumps 434 formed on the front surface 435 that are electrically coupled to the circuit via an interconnect structure, and a plurality of TSV structures 436 that extend through the substrate 432 and may be exposed from the back surface 437. The TSV structures 436 may be electrically coupled to the interconnect structure and/or bonding pads 433. A sufficient amount of force may be applied to the device 430 such that the front surface 435 contacts and adheres to the coating material 404. Further, the micro bumps 434 of device 430 may be aligned with the proper TSV structures 414 of device 402, and positioned proximate to or in contact with the TSV structures 414 for reflowing the micro bumps 434.

Figure 7:
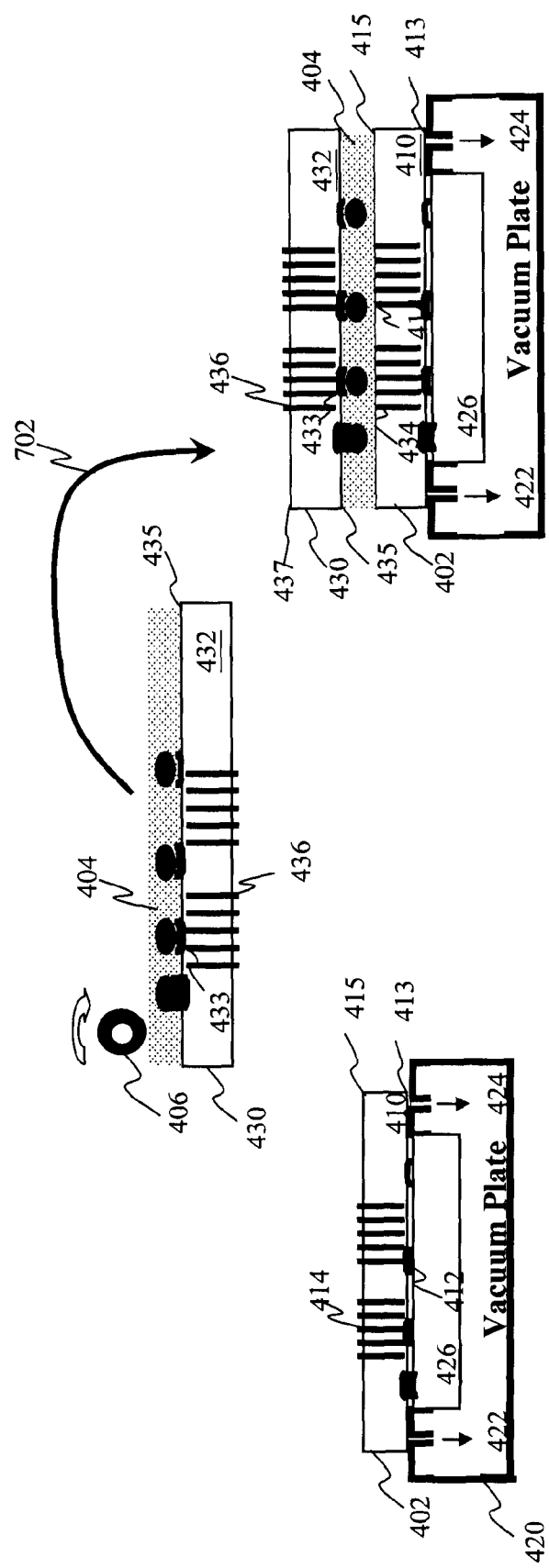
FIG. 7, illustrated are cross-sectional views of the stacked semiconductor device of FIG. 4 being fabricated with an alternative method for forming a coating material.

Alternatively, referring also to FIG. 7, the coating material 404 may optionally be formed on the front surface 435 of device 430 instead of being formed on the back surface 415 of device 402 prior to stacking. Accordingly, the device 430 with the coating material 404 may be flipped over 702 and stacked on the device 402. A sufficient amount of force may be applied to the device 430 such that the front surface 415 of device 402 contacts and adheres to the coating material 404. Further, the micro bumps 434 of device 430 may be aligned with the proper TSV structures 414 of device 402, and positioned proximate to or in contact with the TSV structures 414 for reflowing the micro bumps 434.

Figure 4C:
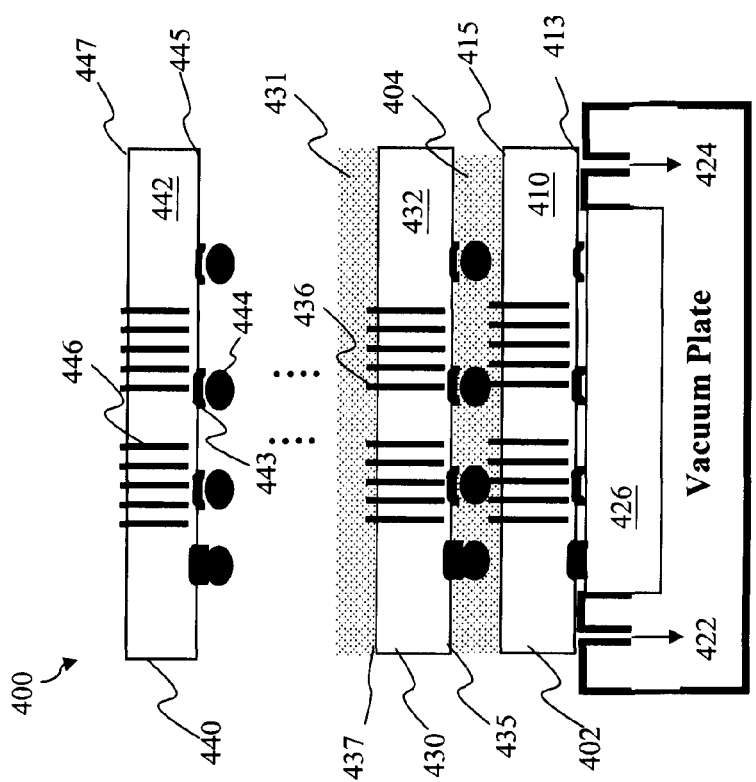

In FIG. 4C, the method 300 continues with block 306 in which a third level device 440 may be placed overlying the second coating material 431 and the second level device 430. The device 440 may include a third coating material (not shown) formed thereon for stacking another device. The device 440 may further include a substrate 442 having various features (similar to the features discussed in device 402) that function as a circuit, a plurality of bonding pads 443 and micro bumps 444 formed on the front surface 445 that are electrically coupled to the circuit via an interconnect structure, and a plurality of TSV structures 446 that extend through the substrate 442 and may be exposed from the back surface 447. The TSV structures 446 may be electrically coupled to the interconnect structure and/or bonding pads 443. A sufficient amount of force may be applied to the device 440 such that the front surface 445 contacts and adheres to the coating material 431. Also, the micro bumps 444 of device 440 may be aligned with the proper TSV structures 436 of device 430, and positioned proximate to or in contact with the TSV structures 436 for reflowing the micro bumps 444.

It should be noted that the coating material 431 may optionally be formed on the front surface 445 of device 440 instead of being formed on the back surface 437 of device 430 prior to stacking, as was similarly discussed above in FIG. 7. Accordingly, subsequent coating materials may be formed in a similar manner for stacking additional devices to form the stacked semiconductor device 400.

The process above may be repeated for each additional device that is to be stacked, and the number of devices may vary depending on the design requirements of the stacked semiconductor device 400. It should be noted that only three devices are described for the sake of clarity and a better understanding of the disclosed embodiments. In FIG. 4D, after the last device has been stacked, the method 300 continues with block 308 in which the coating materials 404, 431 may be cured in the same thermal process. The semiconductor device 400 may be transferred to a heating chamber 450 such as an oven, and the semiconductor device 400 may be heated 455 to a desired temperature or range of temperatures for a period of time (e.g., curing/reflow cycle). For example, the temperature range may be from 200 to 300° C. The heating chamber 450 may include a heat source such as a flash lamp, ultraviolet illumination, or other suitable heating mechanisms. As previously noted, each coating material 404, 431 includes an epoxy polymer for encapsulating and a flux component for reflowing. Accordingly, responsive to the heating, the epoxy polymer fully cures and encapsulates the various structures between the devices 402, 430, and 440, and provides the required mechanical strength and stability for stacking and bonding the devices. Simultaneously, the flux component reflows the micro bumps 434, 444, and forms a solder joint with the corresponding TSV structures 414, 436.

Therefore, the circuits of the devices 402, 430, and 440 may be electrically coupled to each other to form a circuit for the stacked semiconductor device 400. Accordingly, the coating materials 404, 431 are fully cured and the micro bumps 434, 444 are reflowed in the same curing/reflow cycle, and thus the coating materials 404, 431 may have substantially similar thermal histories. This greatly reduces the thermal stress of the coating materials 404, 431 even as the number of devices being stacked increases since all the coating materials will still be subjected to one curing/reflowing cycle. The various defects induced by thermal stress as discussed in FIG. 2 may be minimized, and thus the performance and reliability of the semiconductor device 400 may be improved. Further, since the coating materials 404, 431 may be configured as a high viscosity solid film or a B-stage polymer for device stacking, voids formed in the coating materials 404, 431 will be reduced as compared to using a low viscosity liquid NFU as discussed in FIG. 2.

Additionally, the semiconductor device 400 may optionally be subjected to a post-treatment process in a heating chamber to fully crosslink the epoxy polymer of the coating materials 404 and 431. In the post-treatment process, the semiconductor device 400 may be heated to a temperature range from 100 to about 200° C. The heating chamber may include a heat source such as a flash lamp, ultraviolet illumination, or other suitable heating mechanisms.

Figure 4E:
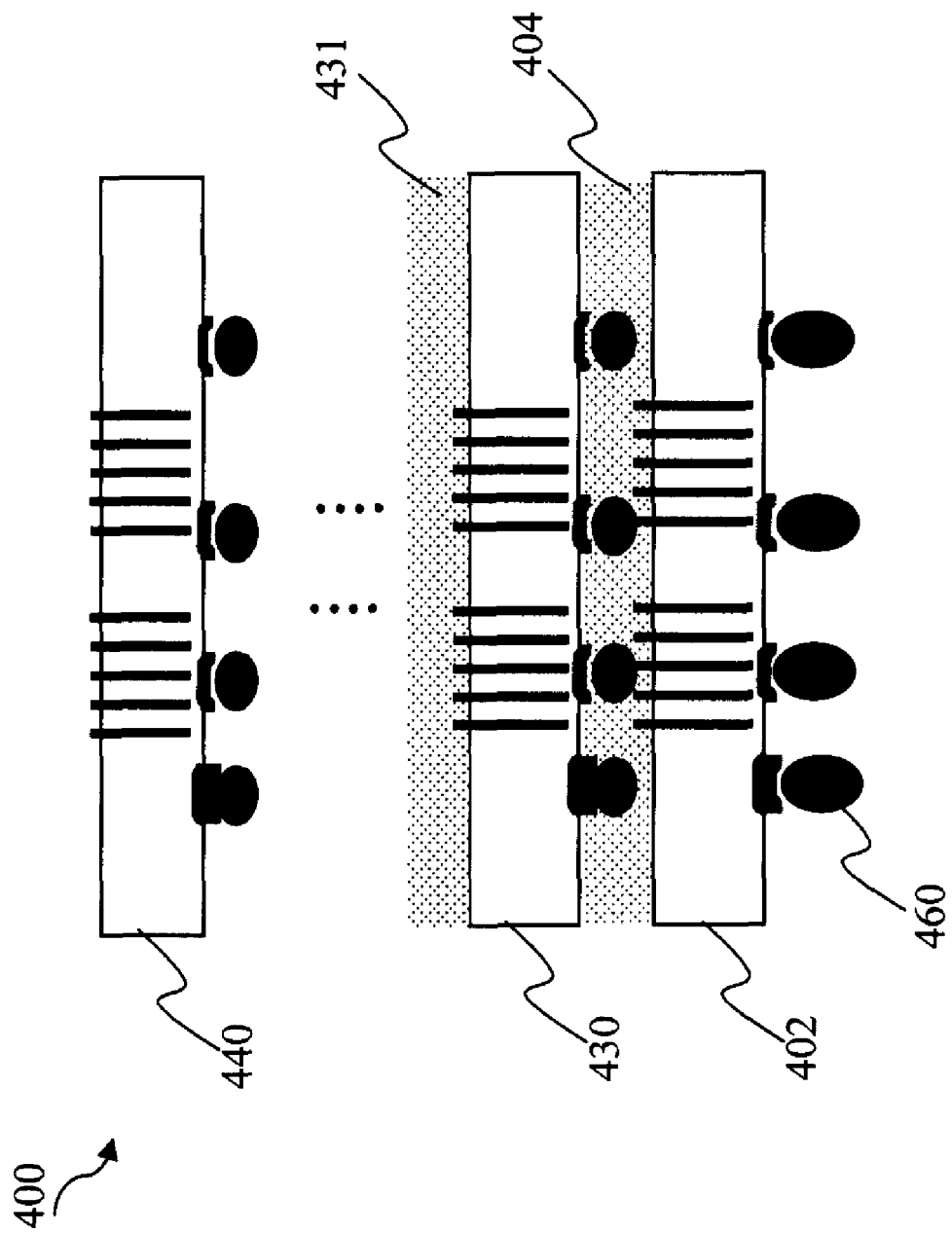

In FIG. 4E, after the curing/reflow process, the stacked semiconductor device 400 may be removed from the vacuum plate 420 by turning off the vacuum suction force 422, 424. The semiconductor device 400 may further include a plurality of solder bumps (or balls) 460 for use in flip-chip packaging technology, and other suitable packaging technologies. The devices 402, 430, 440 may each include a chip (or die), and thus the method 300 of FIG. 3 may be implemented for chip-to-chip stacking and bonding. Alternatively, the devices 402, 430, 440 may each include a wafer, and thus the method 300 of FIG. 3 may be implemented for wafer-to-wafer stacking and bonding.

Figure 5:
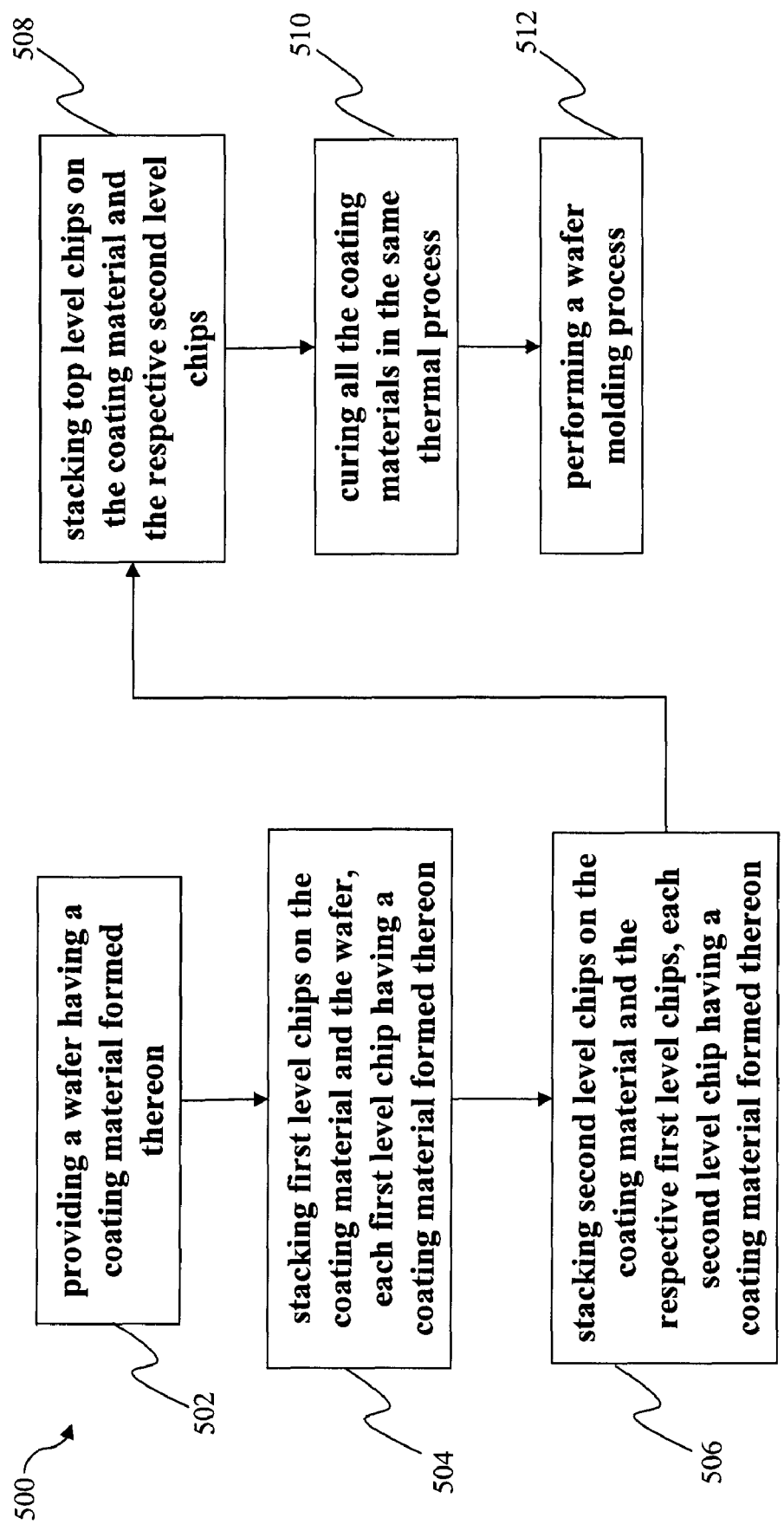
FIG. 5, illustrated is a flowchart of an alternative method for fabricating a stacked semiconductor device according to various aspects of the present disclosure.

Referring to Referring to FIG. 5, illustrated is a method 500 for fabricating a stacked semiconductor device. Referring also to FIGS. 6A to 6F, illustrated are cross sectional views of a stacked semiconductor device 600 being fabricated according to the method 500 of FIG. 5. The stacked semiconductor device 600 is similar to the stacked semiconductor device 400 of FIG. 4 except that the device 600 includes die-to-wafer stacking and bonding. Similar features in FIGS. 4 and 6 are numbered the same for the sake of simplicity and clarity.

In FIG. 6A, the method 500 begins with block 502 in which a wafer 602 such as a semiconductor wafer may be provided with a coating material 404 formed thereon. The wafer 602 may include various semiconductor features (similar to the features discussed in device 402) that function as a circuit, a plurality of bonding pads 607 and conductive bumps 608 (e.g., Au, Cu, or other suitable conductive material) formed on the front surface 609 that are electrically coupled to the circuit via an interconnect structure (not shown). The conductive bumps 608 may be used in flip-chip packaging technology or other suitable packaging technologies. The wafer 602 may further include a plurality of redistribution layer (RDL) structures (not shown) for rerouting the bonding pads to various areas of the wafer 602. The wafer 602 may further include a plurality of through-silicon via (TSV) structures 610, 611, 612 that extend through the wafer 602 and may be exposed from the back surface 613. Each of the TSV structures 610, 611, 612 may be formed in a portion of the wafer 602 for coupling to a plurality of chips as discussed below. The TSV structures 610, 611, 612 may be electrically coupled to the circuit via the interconnect structure, and may be electrically coupled to the bonding pads and/or other conductive features. Alternatively, the TSV structures 610, 611, 612 may be part of the interconnect structure.

The wafer 602 may be secured to a vacuum plate 420 that is capable of providing a vacuum suction force 422, 424. The vacuum plate 420 may also provide a stable base support for stacking a number of devices to form the stacked semiconductor device 600. The vacuum plate 420 may include a support plate 426 with a buffer layer formed thereon for supporting an area of the front surface 609 of the wafer 602 that includes various structures such as conductive bumps 608. Accordingly, these various structures on the front surface 609 of the wafer 602 are prevented from being damaged during the stacking process. The area of the front surface 609 of the wafer 602 that does not include external structures has a substantially flat surface, and may be well suited for securing to the vacuum plate 420 via the suction force 422, 424.

In FIG. 6B, the method 500 continues with block 504 in which a plurality of first level chips 621, 622, 623 may be stacked on the coating material 404 and the wafer 602. It should be noted the number of first level chips may vary, and that only three chips are shown for the sake of clarity and better understanding of the disclosed embodiments. The chips 621, 622, 623 may each include a circuit such as memory cells, and a bump layer 630 (including bonding pads) for electrically coupling to the corresponding TSV structures 610, 611, 612 of the wafer 602. Accordingly, the circuits of chips 621, 622, 623 may be electrically coupled to the circuit of wafer 602. The bump layer 630 may include solder bumps, Au bumps, Cu bumps, or other suitable conductive bumps known in the art. Each of the chips 621, 622, 623 may further include a plurality of TSV structures 632 for coupling to other chips as discussed below. The chips 621, 622, 623 may be stacked on the wafer 602 by a robotic arm 640 or other suitable mechanism such that the bump layer 630 is accurately aligned with the corresponding TSV structures 610, 611, 612, and the bump layer 630 is proximate to or in contact with the corresponding TSV structures for reflowing. Further, the chips 621, 622, 623 may be held in place by the coating material 404. The chips 621, 622, 623 may further include a coating material 645 formed thereon, the coating material 645 may be substantially similar as the coating material 404 and may be formed in a similar manner.

Figure 8A:
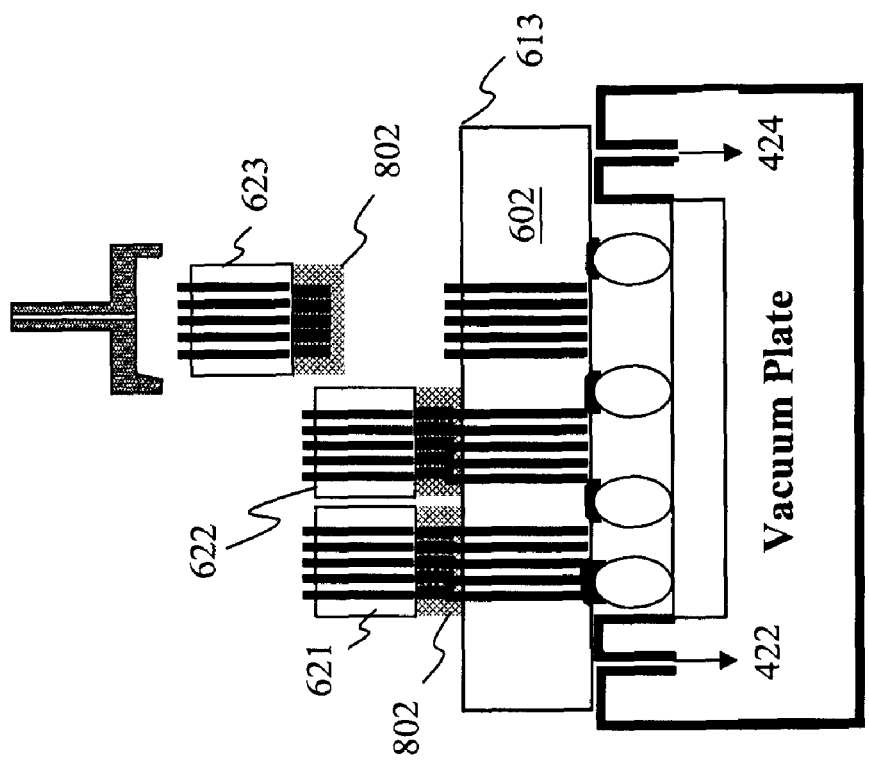
FIGS. 8A and 8B, illustrated are cross-sectional views of the stacked semiconductor device of FIG. 6 being fabricated with an alternative method for forming a coating material.
Figure 8A:
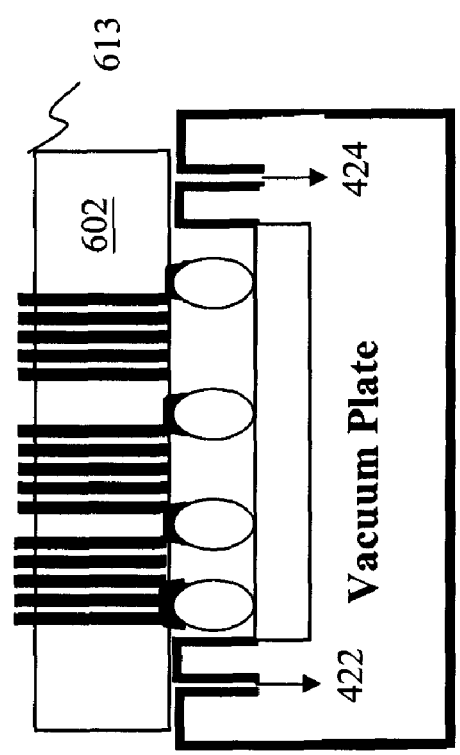

Alternatively, referring also to FIG. 8A, a coating material 802 (similar to the coating material 404 in FIG. 6A) may be formed on the first level chips 621, 622, 623 instead of being formed on the back surface 613 of the wafer 602 (in FIG. 6A) prior to stacking the first level chips on the wafer as discussed above in FIG. 6B.

Figure 6D:
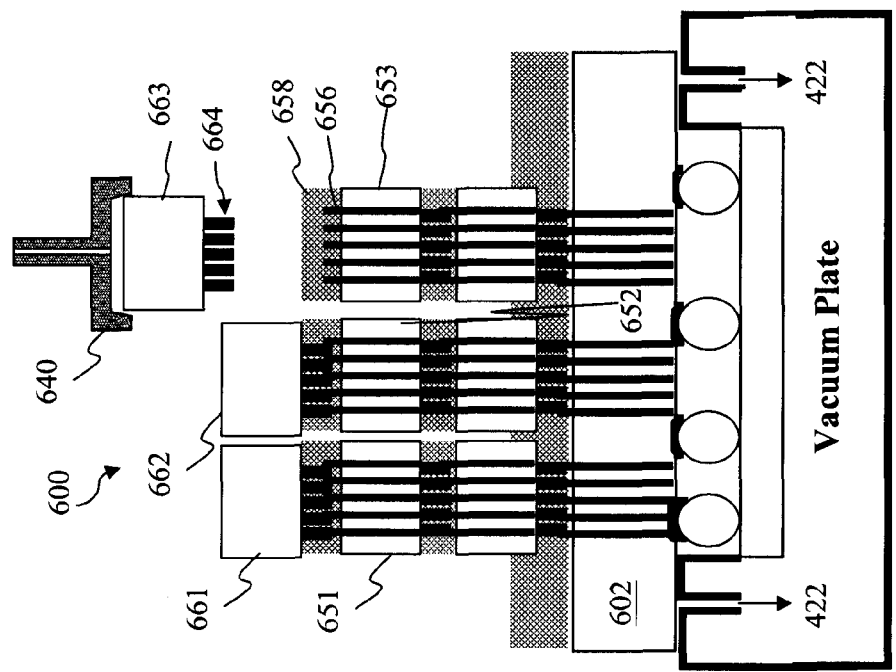
Figure 6C:
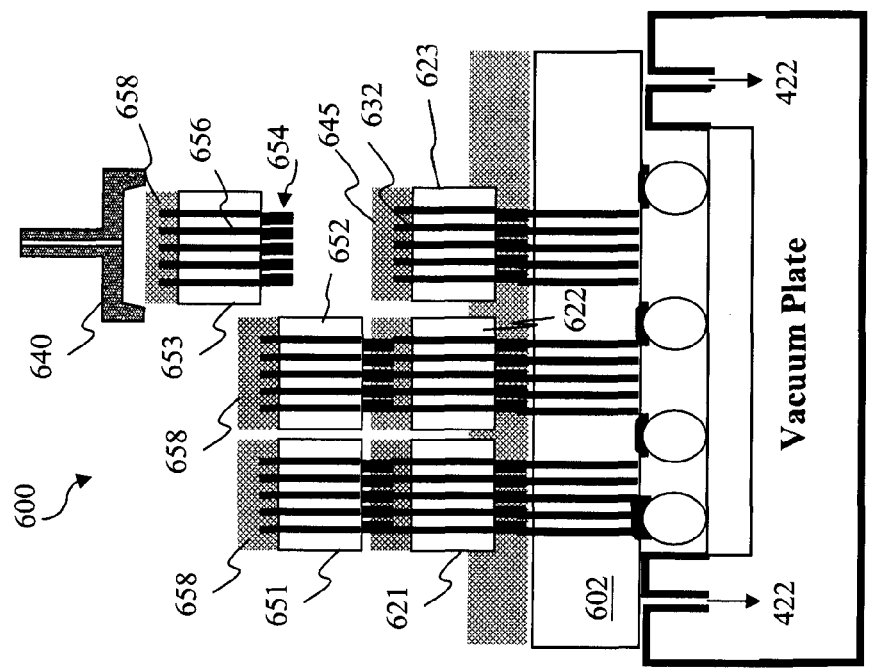

In FIG. 6C, the method 500 continues with block 506 in which a plurality of second level chips 651, 652, 653 may be stacked on the coating material 645 and the first level chips 621, 622, 623, respectively. The chips 651, 652, 653 may each include a circuit such as memory cells, and a bump layer 654 (including bonding pads) for electrically coupling to the TSV structures 632 of the corresponding first level chips 621, 622, 623. Accordingly, the circuits of chips 651, 652, 653 may be electrically coupled to the circuits of the chips 621, 622, 623, respectively. The bump layer 654 may include solder bumps, Au bumps, Cu bumps, or other suitable conductive bumps known in the art. Each of the chips 651, 652, 653 may further include a plurality of TSV structures 656 for coupling to other chips as discussed below. The chips 651, 652, 653 may be stacked on the chips 621, 622, 623 by a robotic arm 640 such that the bump layer 654 is accurately aligned with the TSV structures 632 of the corresponding chips 621, 622, 623, and the bump layer 654 is proximate to or in contact with the TSV structures for reflowing. Further, the chips 651, 652, 653 may be held in place by the coating material 645. The chips 651, 652, 653 may further include a coating material 658 formed thereon, the coating material 658 may be substantially similar as the coating material 404 and may be formed in a similar manner.

Figure 8B:
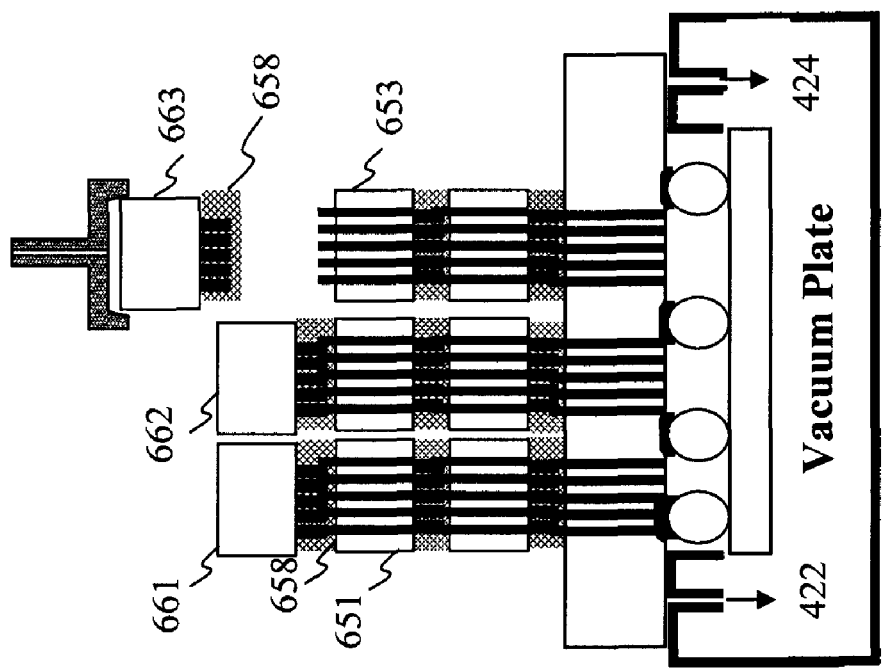
Figure 8B:
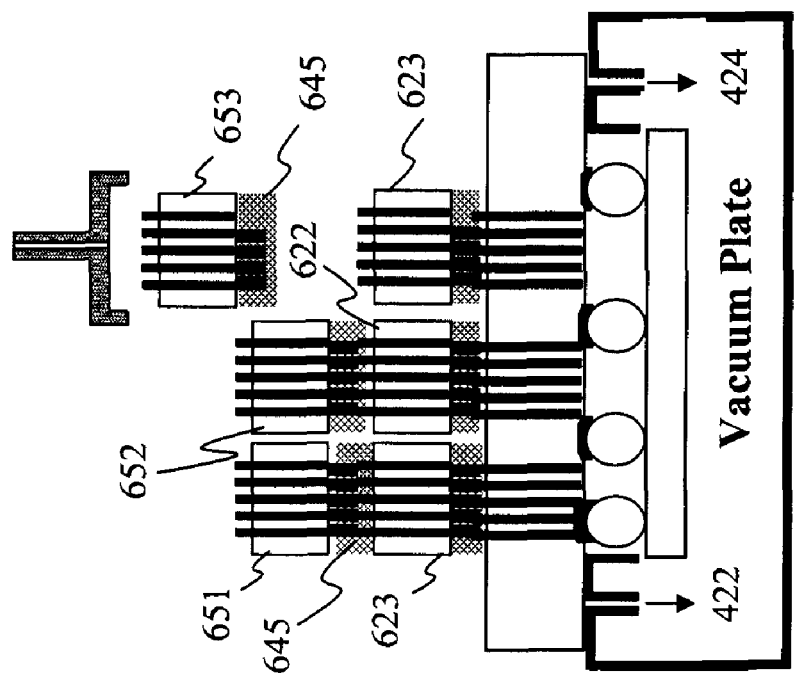

Alternatively, referring also to FIG. 8B, the coating material 645 may be formed on the second level chips 651, 652, 653 instead of being formed on the first level chips 621, 622, 623 (in FIG. 6B) prior to stacking the second level chips on the respective first level chips as discussed above in FIG. 6C.

In FIG. 6D, the method 500 continues with block 508 in which a plurality of top level chips 661, 662, 663 may be stacked on the coating material 658 and the chips 651, 652, 653, respectively. It should be noted the number of levels may vary depending on the design requirements of the stacked semiconductor device 600, and that only three levels are shown for the sake of clarity and better understanding of the disclosed embodiments. The chips 661, 662, 663 may each include a circuit such as memory cells, and a bump layer 664 for electrically coupling to the TSV structures 656 of the corresponding chips 651, 652, 653. Accordingly, the circuits of chips 661, 662, 663 may be electrically coupled to the circuits of chips 651, 652, 653, respectively. The bump layer 664 may include solder bumps, Au bumps, or Cu bumps. The chips 661, 662, 663 may not include TSV structures and coating material since these are the top level chips and no other chips will be stacked over them. The chips 661, 662, 663 may be stacked by a robotic arm 640 such that the bump layer 664 is accurately aligned with the TSV structures 656 of the corresponding chips 651, 652, 653, and the bump layer 664 is proximate to or in contact with the corresponding TSV structures for reflowing.

Alternatively, referring also to FIG. 8B, the coating material 658 may be formed on the top level chips 661, 662, 663 instead of being formed on the second level chips 651, 652, 653 (in FIG. 6C) prior to stacking the top level chips on the respective second level chips as discussed above in FIG. 6D.

Figure 6E:
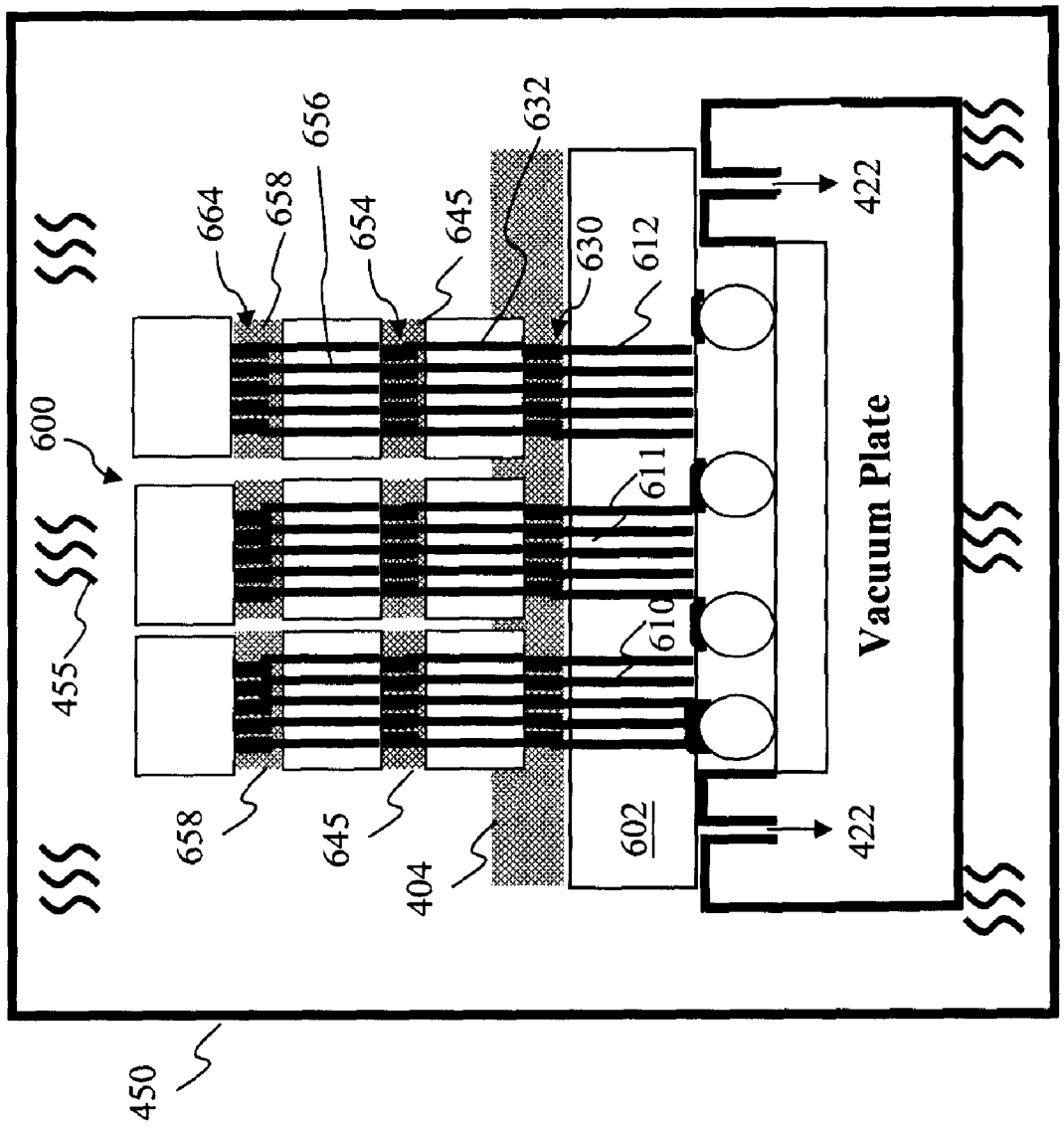

In FIG. 6E, the method 500 continues with block 510 in which the coating materials 404, 645, 658 may be cured in the same thermal process. The semiconductor device 600 may be transferred to a heating chamber 450 such as an oven, and the semiconductor device 600 may be heated 455 to a desired temperature or range of temperatures for a period of time (e.g., curing/reflow cycle). For example, the temperature range may be from 200 to 300° C. As previously noted, each coating material 404, 645, 658 includes an epoxy polymer for encapsulating and a flux component for reflowing. Accordingly, responsive to the heating, the epoxy polymer fully cures and encapsulates the various structures between the chips 621-623, 651-653, 661-663, and between the chips 621-623 and wafer 602, and provides the required mechanical strength and stability for stacking and bonding the chips and wafer. Simultaneously, the flux component reflows the bump layers 630, 654, 664, and forms a electrical joint with the corresponding TSV structures 610-612, 632, 656.

Accordingly, the coating materials 404, 645, 658 are fully cured and the bump layers 630, 654, 664 are reflowed in the same curing/reflow cycle, and thus the coating materials 404, 645, 658 may have substantially similar thermal histories. This greatly reduces the thermal stress of the coating materials 404, 645, 658 even as the number of devices being stacked increases since all the coating materials will still be subjected to one curing/reflowing cycle. The various defects induced by thermal stress as discussed in FIG. 2 may be minimized, and thus the performance and reliability of the semiconductor device 600 may be improved. Further, since the coating materials 404, 645, 658 may be configured as a high viscosity solid film or a B-stage polymer for device stacking, voids formed in the coating materials 404, 645, 658 will be reduced as compared to using a low viscosity liquid NFU as discussed in FIG. 2.

Additionally, the semiconductor device 600 may optionally be subjected to a post-treatment process in a heating chamber to fully crosslink the epoxy polymer of the coating materials 404, 645, 658. In the post-treatment process, the semiconductor device 600 may be heated to a temperature range from 100 to about 200° C. The heating chamber may include a heat source such as a flash lamp, ultraviolet illumination, or other suitable heating mechanisms.

Figure 6F:
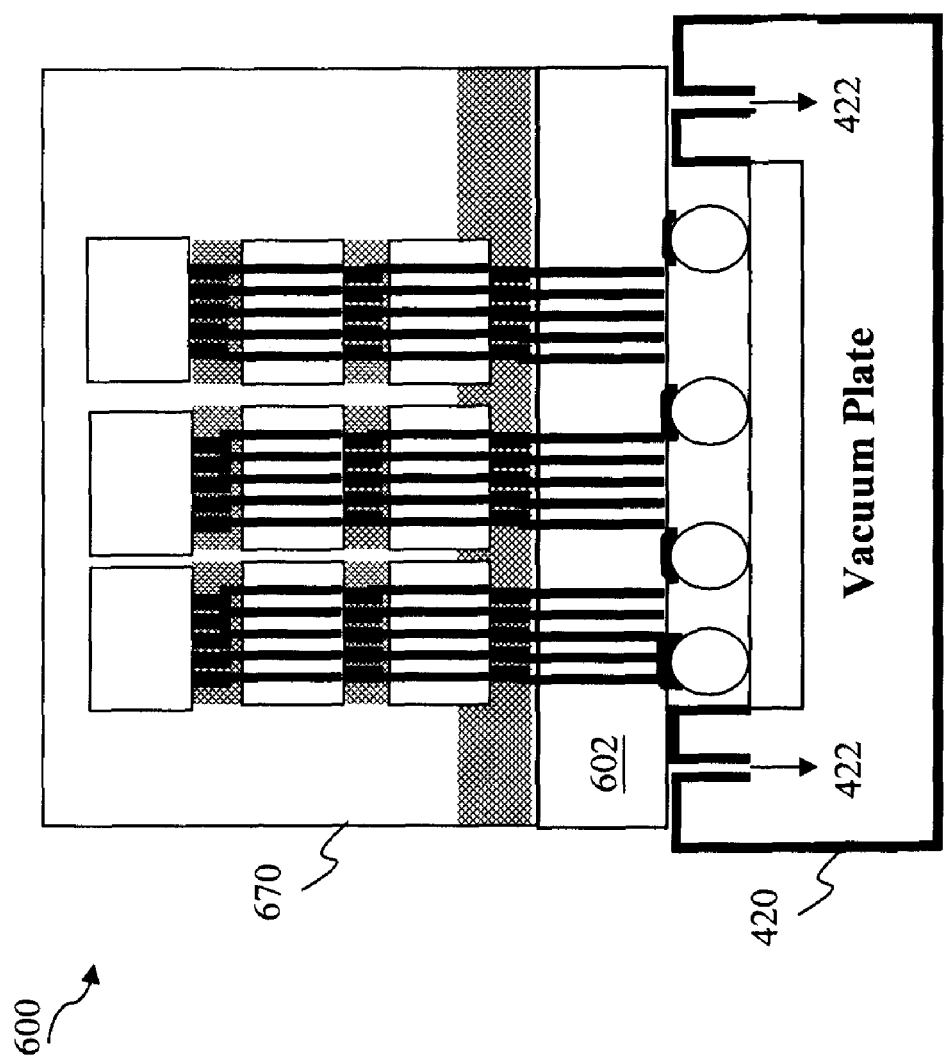

In FIG. 6F, the method 500 continues with block 512 in which the semiconductor device 600 may undergo a wafer molding process. A molding compound 670, NFU, or other suitable material may be formed partially surrounding the semiconductor device 600 for protection and mechanical strength. The semiconductor device 600 may be removed from the vacuum plate 420 and may undergo further semiconductor processing.

Thus, provided is a method for fabricating a semiconductor device which includes providing a first device, a second device, and a third device, providing a first coating material between the first device and the second device, providing a second coating material between the second device and the third device, and thereafter, curing the first and second coating materials in a same process. In some embodiments, the first, second, and third devices each include a circuit, the first and second devices each include a through silicon via (TSV) structure, and the method further includes, responsive to the curing, electrically coupling the circuits of the first, second, and third devices using the TSV structure of the first and second devices, wherein the first and second coating materials both include a flux component that facilitates the coupling. In some other embodiments, the first, second, and third devices are each one of a die and a wafer.

In still other embodiments, the third device includes a third coating material formed thereon, and the method includes overlying a fourth device on the third coating material and the third device prior to the curing, the fourth device being one of a die and a wafer, wherein the curing includes curing the third coating material such that the third coating material transforms form the first state to a second state substantially the same as the first and second coating materials. In other embodiments, the method further includes pre-treating the first and second coating materials prior to the curing. In some embodiments, the pre-treating includes heating the first and second coating materials to a temperature that is less than a curing temperature of the first and second coating materials. In other embodiments, the method further includes post-treating the first and second coating materials after the curing.

In some other embodiments, the step of providing the first coating material includes forming the first coating material on the first device, and overlying the second device on the first coating material and the first device, and the step of providing the second coating material includes forming the second coating material on the second device, and overlying the third device on the second coating material and the second device. In still other embodiments, the step of providing the first coating material includes forming the first coating material on the second device, and overlying the second device with the first coating material on the first device, and the step of providing the second coating material includes forming the second coating material on the third device, and overlying the third device with the second coating material on the second device.

Also provided is a semiconductor device that includes a first device, a second device overlying the first device and electrically coupled to the first device, a third device overlying the second device and electrically coupled to the second device, a first coating material disposed between the first and second devices, and a second coating material disposed between the second and third devices, wherein the first and second coating materials are configured with substantially similar thermal histories. In some embodiments, the first and second coating materials have substantially the same curing cycles. In other embodiments, the first, second, and third devices are each one of a die and a wafer. In some other embodiments, the method further includes providing a fourth device, the fourth device being one of a die and a wafer, providing a third coating material between the third device and the fourth device, and the step of curing includes curing the third coating material in the same process as the first and second coating materials.

In still other embodiments, the first, second, and third devices each include a plurality of through silicon via (TSV) structures. In some embodiments, one of the TSV structures of the first device is electrically coupled to one of the TSV structures of the second device, and where one of the TSV structures of the second device is electrically coupled to one of the TSV structures of the third device. In other embodiments, the first device includes a plurality of conductive bumps for connecting to another semiconductor device. In some other embodiments, the semiconductor device further includes a carrier substrate for supporting a structure, and the first device overlies the carrier substrate and is secured to the carrier substrate.

Additionally, a method for fabricating a stacked semiconductor device is provided which includes providing a first device having a circuit and a first coating material formed thereon, stacking a second device on the first coating material and the first device, the second device having a circuit and a second coating material formed thereon, stacking a third device on second coating material and the second device, the third device having a circuit, and performing one thermal process that electrically couples the circuits of the first, second, and third devices to form a circuit of the stacked semiconductor device. In some embodiments, the method further includes pre-treating the first and second coating materials prior to the one thermal process, where a temperature of the pre-treating is from about 80° C. to about 150° C. In some other embodiments, the method further includes post-treating the first and second coating materials after the one thermal process, where a temperature of the post-treating is from about 100° C. to about 200° C. I In still other embodiments, a temperature of the one thermal process is from about 200° C. to about 300° C. In other embodiments, the fourth device includes a third coating material formed thereon, the third coating material substantially the same as the first and second coating materials, the method further includes stacking a fifth device on the third coating material and the fourth device, the fifth device being a chip with a circuit, and the circuit of the fifth device is electrically coupled to the circuit of the fourth device in response to the thermal process. In still other embodiments, the method further includes selecting the first and second coating materials to be one of a B-stage polymer and a solid film.

Although embodiments of the present disclosure have been described in detail, those skilled in the art should understand that they may make various changes, substitutions and alterations herein without departing from the spirit and scope of the present disclosure. For example, although the embodiments disclosed herein uses TSV structures for chip and wafer packaging, it is understood that the methods may be implemented in other traditional packaging technologies that do not use TSV structures. Accordingly, all such changes, substitutions and alterations are intended to be included within the scope of the present disclosure as defined in the following claims.

Several different advantages exist from these and other embodiments. The methods and stacked semiconductor devices disclosed herein provide a simple and cost-effective technique for minimizing various defects induced by thermal stress in stacked semiconductor devices. Thus, the performance and reliability of stacked semiconductor devices will be improved. The curing/reflowing of the coating layers of the stacked semiconductor device are performed in one thermal process. Accordingly, the fabrication of stacked semiconductor devices will take less processing time, and fewer equipment will be used to complete a full multilayer process thereby reducing costs. The coating material disclosed herein may be configured as a lamination or tape such that it is easy to apply to devices before they are stacked and bonded together to form a stacked semiconductor device. Further, the methods and stacked semiconductor devices disclosed herein may be implemented for chip-to-chip stacking, wafer-to-wafer stacking, and chip-to-wafer stacking.

We claim:

1. A method for fabricating a semiconductor device, comprising:
   providing a first device including a first through-silicon via (TSV) structure;
   forming a first coating material over the first device, wherein the first coating material continuously extends over the first device and covers the first TSV structure;
   providing a second device over the first device and within the first coating material, wherein the second device includes a second TSV structure and a plurality of conductive bumps, wherein providing the second device includes positioning the plurality of conductive bumps within the first coating material;
   forming a second coating material over the second device, wherein the second coating material continuously extends over the second device and covers the second TSV structure;
   providing a third device over the second coating material, wherein the third device includes a third TSV structure;
   pre-treating the first and second coating materials; and
   thereafter, curing the first and second coating materials in a same process.

2. The method of claim 1,
   wherein the first, second, and third devices each include a circuit;
   wherein the first and second coating materials both include a flux component; and
   wherein the circuits of the first, second, and third devices are electrically coupled in response to the curing, using the TSV structures.

3. The method of claim 1, wherein the first, second, and third devices are each dies.

4. The method of claim 3, including:
   providing a fourth device over a third coating material formed over the third device, wherein the fourth device includes a fourth TSV structure; and
   wherein the curing includes curing the third coating material in the same process as the first and second coating materials.

5. The method of claim 1, wherein a temperature of the pre-treating is from about 80° C. to about 150° C.

6. The method of claim 1, wherein the pre-treating includes heating the first and second coating materials to a temperature that is less than a curing temperature of the first and second coating materials.

7. The method of claim 1, further comprising:
post-treating the first and second coating materials after the curing.

8. The method of claim 7, wherein a temperature of the post-treating is from about 100° C. to about 200° C.

9. The method of claim 1, wherein the curing includes a thermal process having a temperature from about 200° C. to about 300° C.

10. A method for fabricating a stacked semiconductor device, the method comprising:
providing a first device having a first circuit and a first through-silicon via (TSV) structure;
forming a first coating material over the first device, the first coating material continuously extending over the first device and covering the first TSV structure;
stacking a second device on the first coating material, the second device having a second circuit and a second TSV structure and a first plurality of conductive bumps, wherein stacking the second device forces the first plurality of conductive bumps into the first coating material;
forming a second coating material over the second device, the second coating material continuously extending over the second device and covering the second TSV structure;
stacking a third device on the second coating material, the third device having a third circuit and a second plurality of conductive bumps, wherein stacking the third device forces the second plurality of conductive bumps into the second coating material;
pre-treating the first and second coating materials; and
thereafter, performing a thermal process that electrically couples the first, second, and third circuits to form a circuit of the stacked semiconductor device, and that cures the first and second coating materials.

11. The method of claim 10, wherein a temperature of the pre-treating is from about 80° C. to about 150° C.

12. The method of claim 10, further comprising:
post-treating the first and second coating materials after the thermal process, wherein a temperature of the post-treating is from about 100° C. to about 200° C.

13. The method of claim 10, wherein a temperature of the thermal process is from about 200° C. to about 300° C.

14. The method of claim 10, wherein the first and second coating materials include a B-stage polymer.

* * * * *